United States Patent [19]
Pierini et al.

[11] 3,963,968
[45] June 15, 1976

[54] INTERVALOMETER APPARATUS

[76] Inventors: John M. Pierini, 103 Cambridge St., Winchester, Mass. 01890; Leon E. Brown, 11017 Carissa Drive, Dallas, Tex. 75218

[22] Filed: Apr. 22, 1974

[21] Appl. No.: 462,989

[52] U.S. Cl. ............................. 317/141 S; 317/151
[51] Int. Cl.² ........................................ H01H 47/18
[58] Field of Search ..................... 317/141 S, 151

[56]      References Cited
            UNITED STATES PATENTS

| | | |
|---|---|---|
| 3,377,532 | 4/1968 | Lane et al. ....................... 317/141 S |
| 3,562,599 | 2/1971 | Dreitzler ........................... 317/141 S |
| 3,714,519 | 1/1973 | Swinea, Jr. ....................... 317/141 S |
| 3,745,901 | 7/1973 | Miyakawa et al. ............... 317/151 X |

Primary Examiner—R. N. Envall, Jr.
Attorney, Agent, or Firm—John A. Haug

[57]                ABSTRACT

A timing and actuating assembly for a camera to permit time lapse photography includes a solenoid operated shutter release mechanism which is actuated by an electrical pulse derived from a timing circuit. The repetition rate of the pulse is adjustable over a wide range. The timing and actuating assembly is mounted on a bracket for disposition in operative relationship with the camera shutter control. A separate power pack is utilized to provide power for the assembly.

7 Claims, 9 Drawing Figures

— 1 —

INTERVALOMETER APPARATUS

CROSS-REFERENCES

The disclosure contains subject matter found in application Ser. No. 462,656, filed Apr. 22, 1974.

BACKGROUND OF THE INVENTION

This invention relates to a shutter actuating assembly and more particularly to an attachment for a camera or similar device to provide periodic actuation of the shutter.

Time lapse photography, whereby film in a camera is automatically exposed and advanced repeatedly with a given time delay between consecutive exposures is well known. This method of photography has many applications both for the professional and the amateur including traffic flow studies, tracking the relative movement of celestial bodies, the opening of flower buds to name but a few. Although cameras have been equiped with means known as intervalometers for carrying out this method of photography, this equipment has been far too expensive for the average photographer to utilize and generally has had too narrow a range of time adjustments. Other difficiencies of known intervalometers are that they have either been built into or can only be used with a particular camera.

SUMMARY OF THE INVENTION

Among the several objects of this invention may be noted the provision of an intervalometer attachment useful with a variety of cameras which will permit the taking of time lapse pictures; the provision of an intervalometer which is inexpensive yet reliable; and the provision of such intervalometers which have an accurate and wide range of time period adjustments. Other objects and features will be in part apparent and in part pointed out hereinafter.

Briefly, an intervalometer made in accordance with this invention comprises a bracket mounted housing in which is disposed a solenoid having a plunger arranged in operative engagement with a shutter actuating mechanism of a camera. The plunger is either attached to the shutter actuating mechanism through a cable release or is so located that movement of the plunger will depress the shutter actuating mechanism of the camera. The solenoid is actuated by an electrical pulse derived from a circuit comprising a variable clock, a frequency divider network of a plurality of flip flops whose output is tapped to obtain a first pulse rate at one stage and a second pulse rate at another stage. A manual switch provides connection to either stage. A monostable multivibrator is used to shape the pulse received from the divider into the desired time length. A buffer and driver provide the correct current level for proper operation of the solenoid.

BRIEF DESCRIPTION OF DRAWINGS

Corresponding reference characters indicate corresponding parts throughout the several views of the drawings.

DESCRIPTION OF PREFERRED EMBODIMENTS

Figure 1:
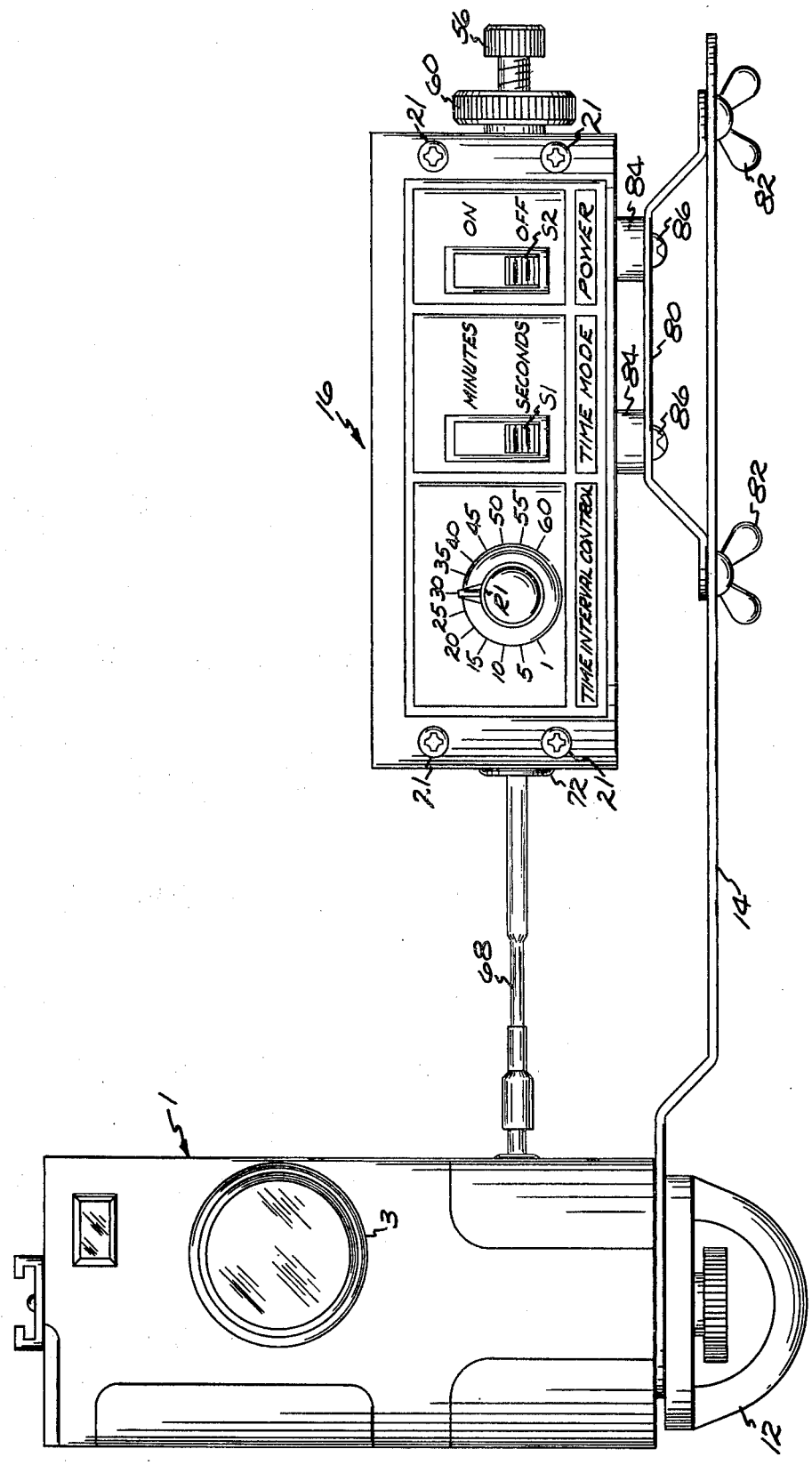
FIG. 1 is a front elevation of a camera with an attachment assembly made in accordance with the invention mounted in operative engagement with a shutter actuation mechanism of the camera.
Figure 2:
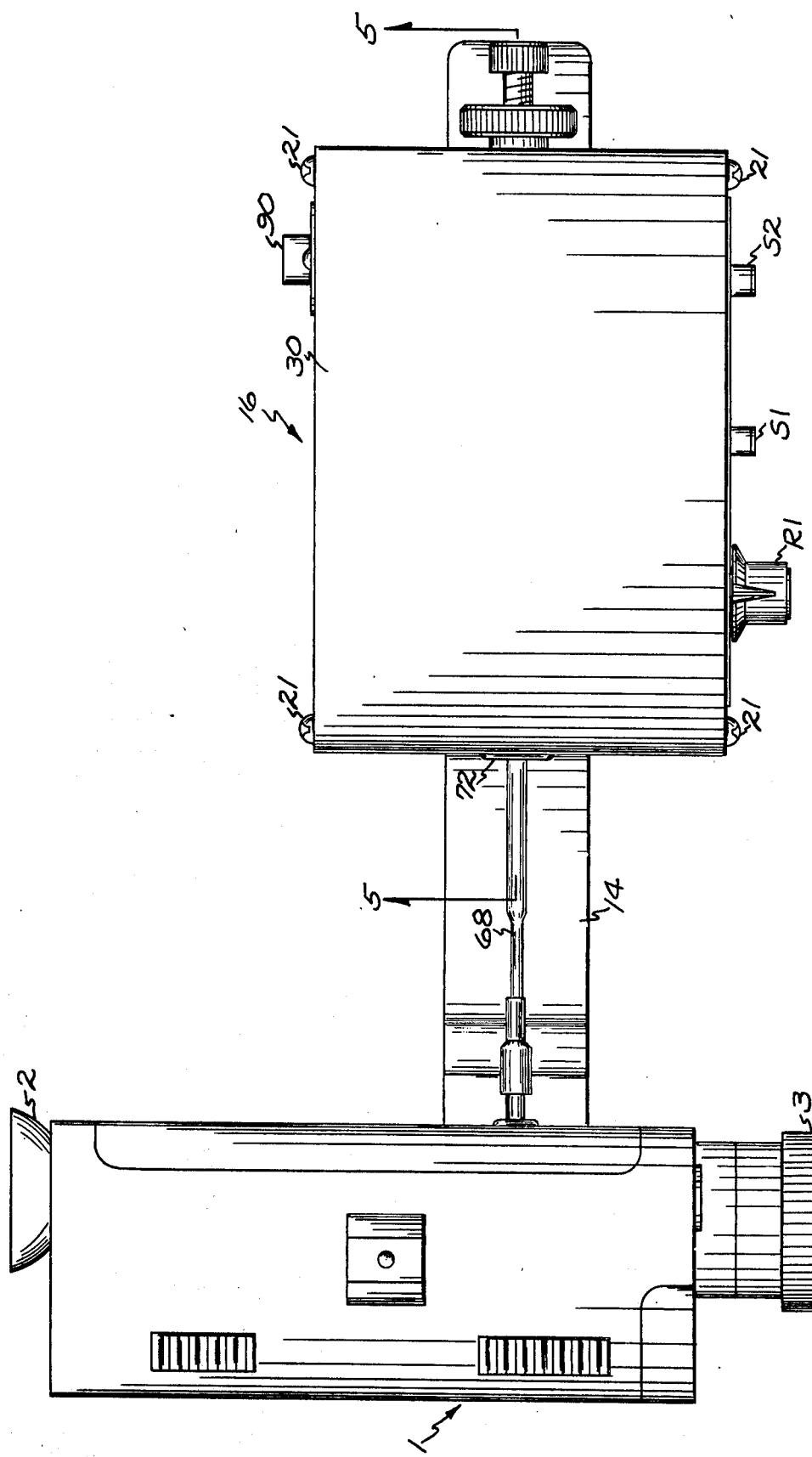
FIG. 2 is a top plan view of the FIG. 1 embodiment.
Figure 3:
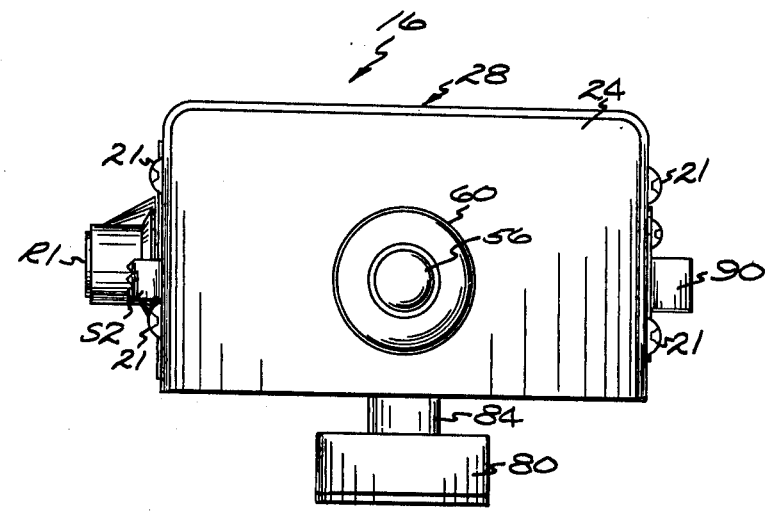
FIG. 3 is a back elevational view of the attachment assembly of FIG. 1.
Figure 5:
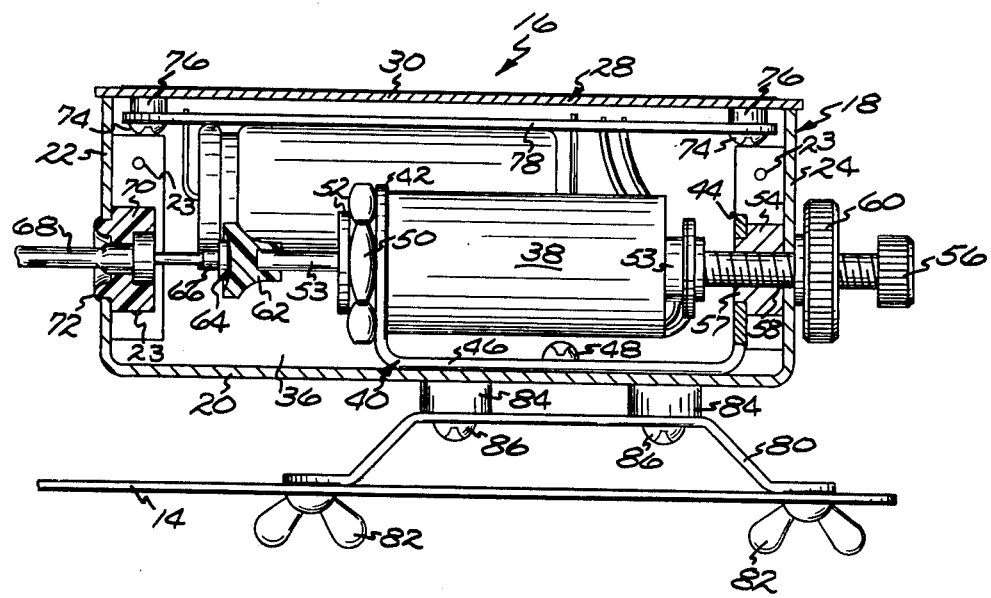
FIG. 5 is a cross sectional view taken on lines 5—5 of FIG. 2.
Figure 6:
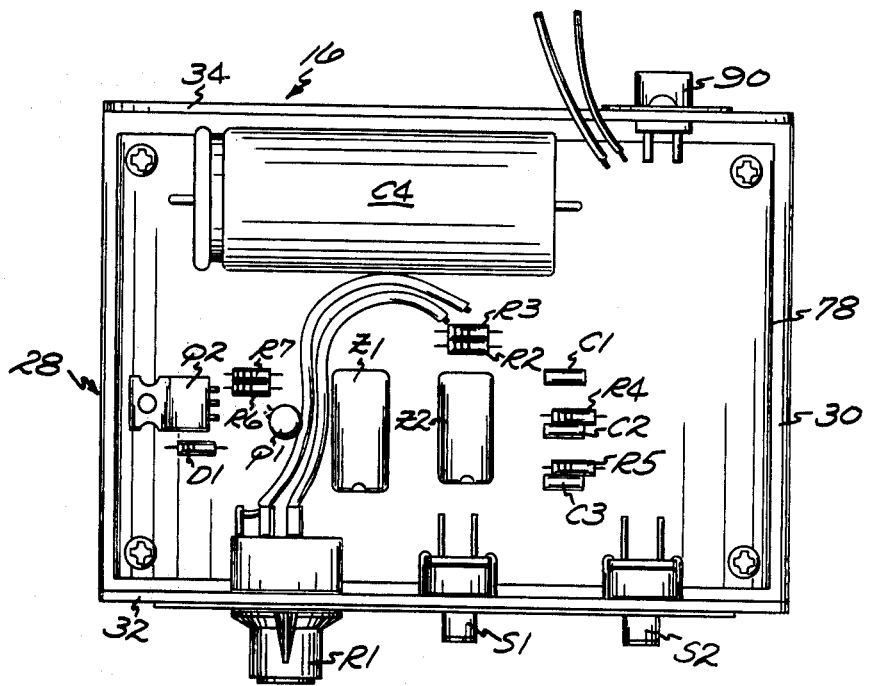
FIG. 6 is a bottom plan view of the cover of the attachment assembly of FIG. 1.

Referring now to FIGS. 1 and 2 reference numeral 1 indicates a camera having a conventional eyepiece 2 and lens 3 supported on a tripod 12 (only partly shown) which also supports bracket 14 mounting an intervalometer 16 made in accordance with the invention. As best seen in FIGS. 5 and 6 intervalometer 16 comprises a housing formed of a first generally U-shaped member 18 having a bottom wall 20 and two opposed upstanding side walls 22, 24 respectively and a second mating generally U-shaped member 28 or cover formed for instance of a malleable metal sheet having a top wall 30 and two opposed depending side walls 32, 34 respectively. Members 18, 28 fit together to enclose therewithin a cavity 36. Tabs 19 may be formed integrally with front and rear ends of walls 22 and 24 and bent inwardly to facilitate fastening of member 28 to member 18 by means of screws 21 (FIGS. 1 and 4) received in threaded bores 23 in the tabs. It is, of course within the purview of the invention to construct the housing in other ways as by having a four sided bottom member or molding the housing out of plastic.

Disposed within the cavity 36 is a solenoid assembly 38 supported on a generally U-shaped solenoid bracket 40 having arms 42, 44 joined by bight 46. Bracket 40 is attached to bottom wall 20 of the housing by any conventional means as by fasteners 48. Aligned apertures are formed in arms 42, 44 to receive the armature assembly 38. Assembly 38 is locked in the desired location by nut 50 received on threaded end 52 of solenoid assembly 38 with plunger 53 projecting therefrom. A bushing 54 is provided with a turned down portion 57 which fits into the aperture in arm 44. Stroke adjustment screw 56 extends through an aperture 58 formed in wall 24 of housing member 18 and is contiguous with plunger 53 in operative engagement therewith. Return force for plunger 53 can conveniently be provided by the spring return force of the cable release mechanism. Thus turning of screw 56 adjusts the stroke and output force of plunger 53 as desired. Lock nut 60 locks screw 56 in its adjusted position.

Plunger 53 extending from end 52 of solenoid assembly 38 is received in plunger nest 62 which provides a seat 64 for the depressable end 66 of a shutter cable release 68. Seat 64 is concave in shape to allow for any slight misalignment of the solenoid relative to the cable release. Cable release 68 is mounted in a nest 70 located in an aperture formed in upstanding wall 22. Nest 70 is fixed to wall 22 as by turning over a tubular section as seen at 72. As seen in FIGS. 1 and 2 cable release 68 is attached to camera 1 in a receiving jack, for instance a single frame jack.

Intervalometer 16 is attached to bracket 14 through mounting bracket 80 which can be attached to bracket 14 by any convenient means as by utilizing threaded studs extending from bracket 80 and cooperating with nuts 82. Mounting bracket 80 is attached to housing member 18 through spacers 84 through which screws 86 extend. Spacers 84 may be provided of varying lengths so that the vertical location of cable release 68 can be adjusted into alignment with receiving jacks of different cameras. Power is supplied from a power pack (not shown) to input 90.

Figure 7:
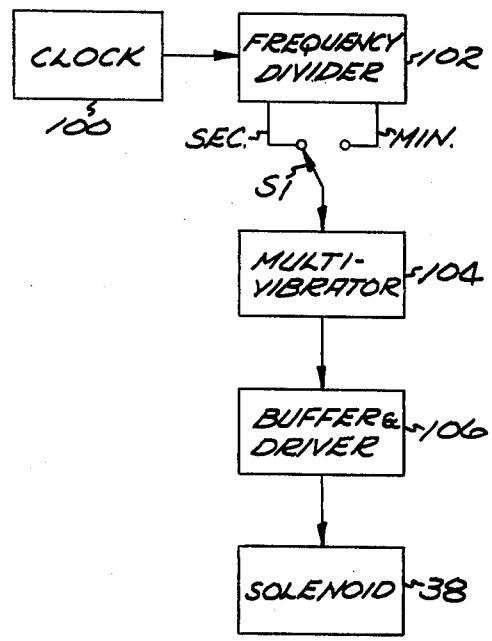
FIG. 7 is a block diagram of the timing and actuating circuit used in the attachment assembly of FIG. 1.
Figure 8:
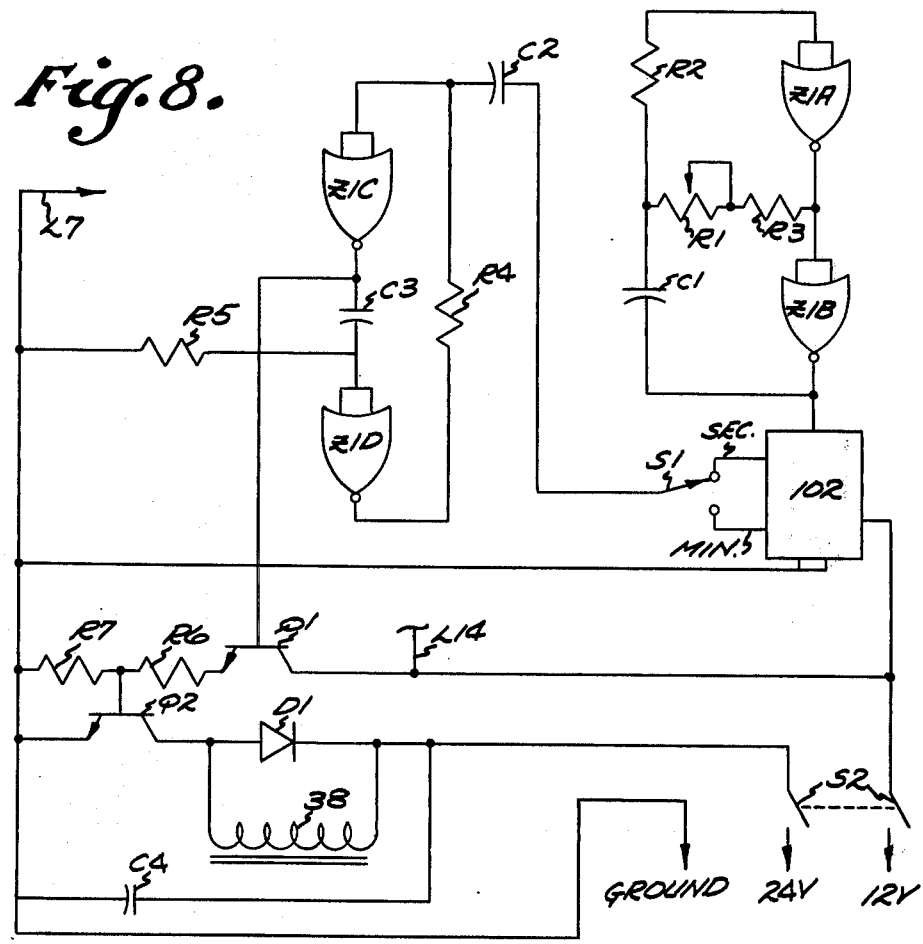
FIG. 8 is a schematic circuit diagram of the FIG. 7 block diagram.

Mounted by any convenient means as by fasteners 74 on the bottom of top wall 30 and spaced therefrom by spacers 76 is a circuit board 78 on which are mounted the various circuit components. As seen in FIG. 7 the circuit comprises a clock or oscillator 100, a frequency divider or counter 102, a multivibrator or timing means 104, a buffer and driver or impedance matching means 106 and finally the solenoid 38. More specifically, as seen in FIG. 8 clock 100 is a variable clock comprising two sections of a quadruple 2-input positive-NOR gate integrated circuit Z1, Z1A and Z1B connected as an astable multivibrator, a two stage oscillator with square wave output. Limiting resistor R2 and serially connected capacitor C1 are connected across Z1A and Z1B and serially connected variable resistor R1 and resistor R3 are connected from a point intermediate Z1A and Z1B to a point intermediate R2 and C1. The output of clock 100 is connected to the input of a fourteen stage counter or flip flop divider chain circuit 102. The output of flip flop circuit 102 which is normally high is preferably taken from the eighth stage identified as SEC in FIG. 8 and the fourteenth stage identified as MIN through respective poles of a double pole switch S1.

Multivibrator 104 connected to the output of frequency divider circuit 102 acts as a timing means for determining the length of time the solenoid 38 is engaged. Multivibrator 104 includes the other two sections of integrated circuit Z1 and comprises NOR gate Z1C serially connected to capacitor C3 and NOR gate Z1D. The output of NOR gate Z1D is connected through resistor R4 to the input of NOR gate Z1C. Capacitor C2 connected between switch S1 and multivibrator 104 ensures that the voltage coupled to multivibrator 104 is in a spike form so that it will not obviate the timing effect of circuit 104. The input of NOR gate Z1D is connected to ground through resistor R5. Capacitors C2 and C3 and resistor R4 and R5 determine the pulse width of the output of multivibrator 104. The output of NOR gate Z1C is connected to the base of NPN transistor Q1 in the buffer and driver circuit 106 which acts as an impedance matching means. Transistor Q1 is connected as an emitter follower to provide amplification for driving NPN transistor Q2. The collector of transistor Q1 is connected through line L14 to the voltage source or pin 14 of Z1 while the emitter is connected to ground through resistors R6 and R7. The base of transistor Q2 is connected to the emitter of transistor Q1 through resistor R6. Resistor R6 determines the current limit to the base of transistor Q2 while resistor R7 insures the turn off of transistor Q2 when the desired actuating pulse is not present. The emitter of transistor Q2 is connected to ground while its collector is serially connected to solenoid 38. Clamping diode D1 is connected across solenoid 38 to provide inductive voltage transient protection for transistor Q2. Solenoid 38 is connected to a 24 volt power supply (not shown) through on-off switch S2 with a capacitor C4 connected across solenoid 38 and transistor Q2 to minimize power supply voltage variation during the "on" time of the solenoid.

A 12 volt power supply used to energize the control circuit is connected through on-off switch S2 to frequency divider 102, integrated circuit Z1 (line L14) and the collector of transistor Q1.

Clock 100, variable over a 60 to 1 ratio of frequencies, generates the time standard of the system. The frequency is determined by the combined resistance of R1 and R3 and the capacitance of C1. Since time contant $TC = (R1 + R3)C_c$ the highest frequency is obtained when resistance R1 is at its minimum. Employing a temperature stable capacitor for C1 and likewise stable resistance elements for R1 and R3 will yield excellent relative temperature stability of the clock. The frequency divider 102 has fourteen flip flops and is tapped at the eighth and fourteenth stages to provide a frequency factor of 64 between the two outputs. The frequency of variable clock 100 is selected such that approximately 1 to 60 pulses per minute will occur at the eighth stage depending upon the setting of variable resistor R1 of the clock and approximately 1 to 60 pulses per hour occur at the fourteenth stage again depending on the setting of resistor R1. Each pulse is shaped into a 50 millisecond pulse by monostable multivibrator 104 (two sections of integrated circuit Z1) each time one of the selected outputs of divider 102 changes logic state. During the fifty millisecond pulse transistor Q2 conducts into saturation and allows current to flow through solenoid 38.

An intervalometer made in accordance with the invention employed the following circuit components:

| | |
|---|---|
| R1 Resistor | 2 megohm ± 10% potentiometer |
| R2 Resistor | 22 megohms |
| R3 Resistor | 18 kilohms |
| R4 Resistor | 330 kilohms |
| R5 Resistor | 330 kilohms |
| R6 Resistor | 120 ohms |
| R7 Resistor | 120 ohms |
| C1 Capacitor | .047 microfarads |
| C2 Capacitor | .1 microfarads |
| C3 Capacitor | .1 microfarads |
| C4 Capacitor | 3000 microfarads |
| D1 Diode | IN4001 |
| Z1 Integrated Circuit | CD 4001A CMOS Quadruple gate |
| Z2 Integrated Circuit | CD 4020A CMOS Binary Divider |
| Q1 Transistor | 2N2222 |
| Q2 Transistor | T1P31 |
| S1 Slide Switch | Single Pole Double Throw |
| S2 Slide Switch | Double Pole Double Throw |

It will be noted that the above circuit components are conveniently mounted on U-shaped cover 28 while the other components including solenoid 38 and its associated mounting structure are mounted on U-shaped bottom member 18 facilitating assembly of the device.

Figure 9:
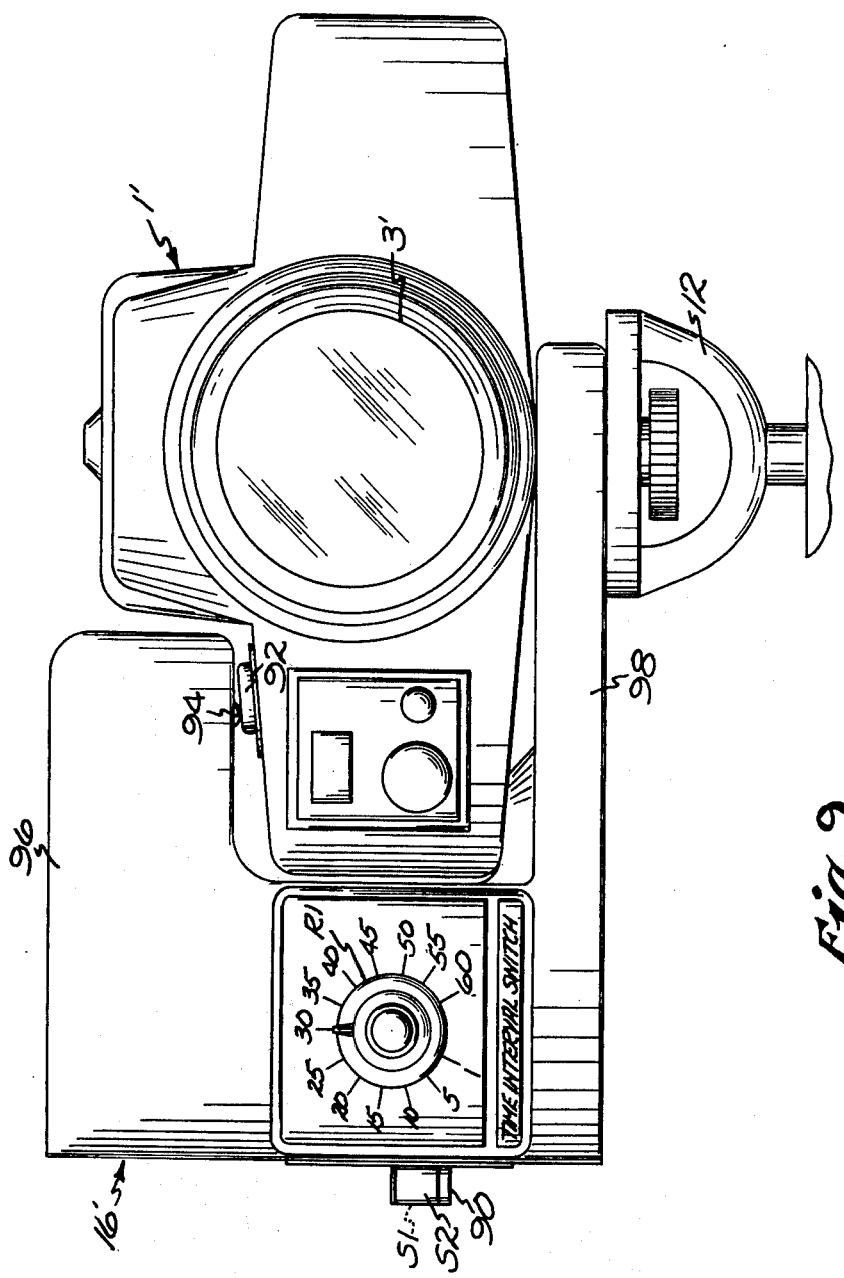
FIG. 9 is a front elevation of a second embodiment of the invention.

In FIG. 9 a second embodiment of the invention is depicted. This embodiment is particularly useful with cameras which do not have jack type actuators. Camera 1' having lens 3' is shown with a pushbutton shutter actuator 92. Camera 1' and intervalometer 16' are mounted on a standard tripod 12. Intervalometer 16' includes the potentiometer R1, switches S1, S2 and power input 90 as in the FIGS. 1–6 structure however the solenoid 38 includes plunger linkage 94 which is located contiguous with button 92. Energization of solenoid 38 will cause movement of plunger 53 as in the FIG. 1–6 embodiment which in turn will cause outward movement of plunger linkage 94 (as seen in FIG. 9) and depression of button 92.

Intervalometer 16' is conveniently forced in a U-shaped configuration to cradle camera 1' with leg 96 extending over the shutter actuating button 92 and leg 98 extending under camera 1', leg 98 being conventionally attachable to tripod 12.

Figure 4:
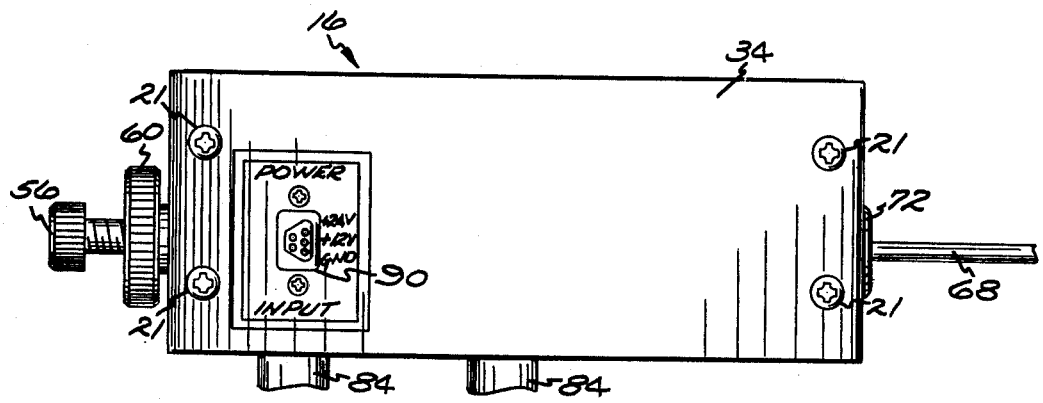
FIG. 4 is a left elevational view of the attachment assembly of FIG. 1.

Appropriate indicia can be located on the intervalometer attachment as by using decals or the like, as seen for instance in FIGS. 1 and 4 to indicate the various controls and power input.

Thus it will be seen that the invention provides an intervalometer attachment which can be used with many different cameras or other similar apparatus such as video tape equipment or the like. The intervalometer of the invention is not only reliable but economical to produce and thus easily available to the public, both amateurs and professionals.

Various changes and modifications in the above-described embodiments will be readily apparent to those skilled in the art and any of such changes or modifications are deemed to be within the spirit and scope of the present invention as set forth in the appended claims.

We claim:

1. Shutter operating apparatus comprising a housing; shutter actuating means mounted in the housing; magnetomotive force generating means mounted in the housing for providing linear motion to the shutter actuating means; and circuit means coupled to the magnetomotive force means; the circuit means comprising a quadruple, two input positive NOR gate, the output of the first gate connected to the input of the second gate, a limiting first resistor and serially connected first capacitor connected across the first and second gates, variable resistance means connected between a point intermediate the limiting resistor and the first capacitor, and a point intermediate the first and second gates; a fourteen stage counter circuit, the output of the second gate connected to the input of the counter circuit; a double pole switch, a first pole of the switch connected to the eighth output stage of the counter circuit and a second pole connected to the fourteenth output stage of the counter circuit; the output of the third gate serially connected to a second capacitor which in turn is serially connected to the input of the fourth gate, the output of the fourth gate connected to the input of the third gate, a second resistor, the input of the fourth gate connected to ground through the second resistor, solid state switching means, the output of the third gate coupled to the solid state switching means, the solid state switching means connected to the magnetomotive force generating means and a source of power to energize the circuit means.

2. Shutter operating apparatus according to claim 1 further including a third capacitor connected between the double pole switch and the third gate and a third resistor connected between the output of the fourth gate and the third capacitor.

3. Shutter operating apparatus according to claim 1 in which the solid state switching means includes a first NPN transistor, the collector of the transistor being connected to the magnetomotive force generating means, the emitter of the transistor connected to ground and the base of the transistor being coupled to the output of the third gate.

4. Shutter operating apparatus according to claim 3 in which an amplifier is interposed between the output of the third gate and the base of the transistor.

5. Shutter operating apparatus according to claim 4 in which the amplifier is a second NPN transistor connected in an emitter-follower configuration with the first transistor.

6. Shutter operating apparatus according to claim 3 further including a clamping diode connected across the magnetomotive force generating means to provide inductive voltage transient protection to the first transistor.

7. Shutter operating apparatus according to claim 3 further including a fourth capacitor connected across the magnetomotive force generating means and the first transistor to minimize supply voltage variations during the on time of the magnetomotive force generating means.

* * * * *